United States Patent
Zhang

(10) Patent No.: US 9,805,813 B2
(45) Date of Patent: Oct. 31, 2017

(54) REDUCTION OF POWER CONSUMPTION IN FLASH MEMORY

(71) Applicant: Empire Technology Development LLC, Wilmington, DE (US)

(72) Inventor: Tong Zhang, Watervliet, NY (US)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 26 days.

(21) Appl. No.: 14/649,505

(22) PCT Filed: Aug. 30, 2013

(86) PCT No.: PCT/US2013/057516
§ 371 (c)(1),
(2) Date: Jun. 3, 2015

(87) PCT Pub. No.: WO2015/030793
PCT Pub. Date: Mar. 5, 2015

(65) Prior Publication Data
US 2016/0118137 A1     Apr. 28, 2016

(51) Int. Cl.
*G11C 29/00*     (2006.01)
*G11C 16/34*     (2006.01)
(Continued)

(52) U.S. Cl.
CPC ........ *G11C 16/3495* (2013.01); *G06F 11/073* (2013.01); *G06F 11/076* (2013.01);
(Continued)

(58) Field of Classification Search
CPC ... G11C 16/3495; G11C 16/26; G06F 11/073; G06F 11/076; G06F 11/0793; G06F 11/048
See application file for complete search history.

(56) References Cited

U.S. PATENT DOCUMENTS 6,268,767 B1    7/2001   Maalej et al.
7,023,735 B2*   4/2006   Ban .................... G11C 11/5628
                                                          365/185.2
(Continued)

FOREIGN PATENT DOCUMENTS

KR     1020100078447 A     7/2010

OTHER PUBLICATIONS

"ioDrive Octal Data Sheet," accessed at http://web.archive.org/web/20130729094432/http://www.fusionio.com/data-sheets/iodrive-octal-data-sheet/ accessed on May 14, 2015, pp. 1-3.
(Continued)

*Primary Examiner* — Esaw Abraham
(74) *Attorney, Agent, or Firm* — Moritt Hock & Hamroff LLP; Steven S. Rubin, Esq.

(57) ABSTRACT

Technologies are generally described for systems, devices and methods effective to reduce power consumption in flash memory. In some examples, a bit error rate estimator module may estimate two or more bit error rates. The two or more bit error rates may be associated with application of respective voltages to read from a memory. A voltage setup module may be configured to be in communication with the bit error rate estimator module. The voltage setup module may be configured to select a voltage to read from the memory. The voltage may be selected based on the two or more bit error rates and based on an error correction level. The error correction level may be a tolerance level available to correct read errors from the memory.

14 Claims, 7 Drawing Sheets

(51) Int. Cl.

| | |
|---|---|
| *G11C 16/30* | (2006.01) |
| *G11C 7/14* | (2006.01) |
| *G11C 29/02* | (2006.01) |
| *G06F 11/10* | (2006.01) |
| *G06F 11/07* | (2006.01) |
| *G11C 16/26* | (2006.01) |
| *G11C 29/44* | (2006.01) |
| *G11C 29/04* | (2006.01) |

(52) U.S. Cl.
CPC ...... *G06F 11/0793* (2013.01); *G06F 11/1048* (2013.01); *G11C 7/14* (2013.01); *G11C 16/26* (2013.01); *G11C 16/30* (2013.01); *G11C 16/349* (2013.01); *G11C 29/021* (2013.01); *G11C 29/028* (2013.01); *G11C 29/4401* (2013.01); *G11C 2029/0411* (2013.01)

(56) References Cited

U.S. PATENT DOCUMENTS

| | | | |
|---|---|---|---|
| 8,351,258 B1 | 1/2013 | Yang et al. | |
| 8,504,884 B2* | 8/2013 | Eguchi | G11C 29/42 714/721 |
| 8,572,445 B2* | 10/2013 | Eguchi | G06F 11/073 365/200 |
| 8,750,042 B2* | 6/2014 | Sharon | G11C 11/5642 365/185.03 |
| 8,891,301 B1* | 11/2014 | Shlick | G11O 5/005 365/185.03 |
| 9,009,390 B2* | 4/2015 | Choi | G11C 16/02 365/189.011 |
| 9,037,946 B2* | 5/2015 | Jeon | G11C 16/3404 714/721 |
| 9,110,824 B2* | 8/2015 | Weng | G06F 11/1008 |
| 9,123,445 B2* | 9/2015 | Ellis | G11C 29/50004 |
| 9,147,490 B2* | 9/2015 | Dusija | G11C 16/34 |
| 2012/0008386 A1 | 1/2012 | Chilappagari et al. | |
| 2013/0007516 A1 | 1/2013 | Wu et al. | |
| 2014/0101519 A1* | 4/2014 | Lee | G06F 11/1068 714/773 |

OTHER PUBLICATIONS

International Search Report for International Application No. PCT/US2013/057516 mailed on May 20, 2014, 4 pages.

Lee, S. And Kim, J. "Using dynamic voltage scaling for energy-efficient flash-based storage devices," International SoC Design Conference (ISOCC), pp. 63-66 (Nov. 22-23, 2010).

Li, H. et al. "Energy-Aware Flash Memory Management in Virtual Memory System," IEEE Transactions on Very Large Scale Integration (VLSI) Systems, vol. 16, No. 8, pp. 952-964 (Aug. 2008).

Liu, N. et al. "On the role of burst buffers in leadership-class storage systems," In Proceedings of the 2012 IEEE Conference on Massive Data Storage, pp. 11 (2012).

Pan, Y. et al., "Exploiting Memory DeviceWear-Out Dynamics to Improve NAND Flash Memory System Performance," Fast'11 Proceedings of the 9th USENIX conference on File and stroage technologies, pp. 1-14 (2011).

Papirla, V. and Chakrabarti, C. "Energy-aware Error Control Coding for Flash Memories," 46th ACM/IEEE on Design Automation Conference, pp. 6 (Jul. 26-31, 2009).

Shalf, J. "Exascale computing technology challenges," in High End Computing File Systems and I/O (HEC FSIO) Workshop, pp. 56 (Aug. 2, 2010).

Shalf, J. et al. "Exascale computing technology challenges," in Proceedings of the International Conference on High Performance Computing for Computational Science, pp. 1-25, Springer-Verlag Berlin Heidelberg (2011).

Springmeyer, R. et al. "From Petascale to Exascale: Eight Focus Areas of R&D Challenges for HPC Simulation Environments," Tech. Rep. LLNL-TR-474731, Lawrence Livermore National Laboratory, pp. 30 (Mar. 18, 2011).

Takeuchi, K.et al., "A source-line programming scheme for low-voltage operation NAND flash memories," IEEE Journal of Solid-State Circuits, vol. 35, No. 5, pp. 672-681 (May 2000).

Takeuchi, K. "Novel co-design of NAND flash memory and NAND flash controller circuits for sub-30nm low-power high-speed solid-state drives (SSD)," IEEE Journal of Solid-State Circuits, vol. 44, No. 4, pp. 1227-1234 (Apr. 2009).

Tanakamaru, S. et al. "Highly reliable and low power SSD using asymmetric coding and stripe bitline-pattern elimination programming," IEEE Journal of Solid-State Circuits, vol. 47, No. 1, pp. 85-96 (Nov. 9, 2011).

Tressler, G. and Sciacca, D. "Enterprise SSD competitive analysis," in Flash Memory Summit, pp. 14 (Aug. 2011).

* cited by examiner

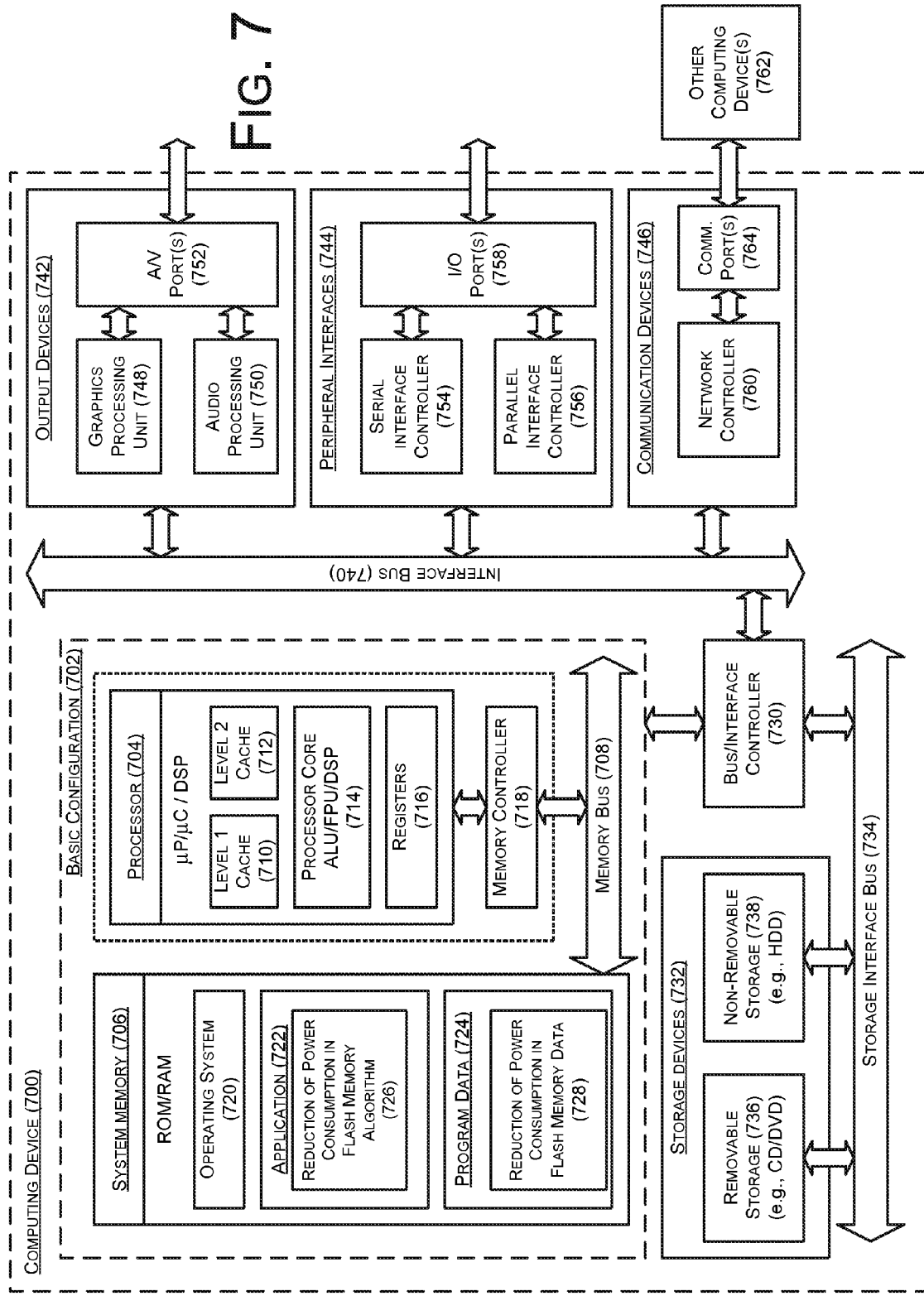

US 9,805,813 B2

REDUCTION OF POWER CONSUMPTION IN FLASH MEMORY

CROSS-REFERENCE TO RELATED APPLICATION

This application is a U.S. National Stage filing under 35 U.S.C. §371 of International Application No. PCT/US13/057516, entitled "REDUCTION OF POWER CONSUMPTION IN FLASH MEMORY," filed on Aug. 30, 2013, the entirety of which is hereby incorporated by reference.

BACKGROUND

Unless otherwise indicated herein, the materials described in this section are not prior art to the claims in this application and are not admitted to be prior art by inclusion in this section.

Flash-based solid state data storage devices may be used to handle intensive data access workloads. A flash memory system may include a multitude of transistors controlled by a solid state memory controller. Each transistor within the flash memory system may be configured to store one bit of data. The solid state memory controller may be configured to control access to data stored within transistors of the flash memory system. Transistors in flash memory may have a limited number of program/erase cycles.

SUMMARY

In one example, a memory controller is generally described. The memory controller may include a bit error rate estimator module. The bit error rate estimator module may be configured to estimate two or more bit error rates. The two or more bit error rates may be associated with application of respective voltages to read from a memory. The memory controller may further include a voltage setup module. The voltage setup module may be configured to be in communication with the bit error rate estimator module. The voltage setup module may be further configured to select a voltage to read from the memory. The voltage may be selected based on the two or more bit error rates and based on an error correction level. The error correction level may be a tolerance level available to correct read errors from the memory.

In one example, a method to operate a memory is generally described. The method may include estimating two or more bit error rates. The two or more bit error rates may be associated with application of respective voltages to read from a memory. The method may further include identifying an error correction level available to correct read errors from the memory. The method may further include selecting a voltage to read from the memory. The voltage may be selected based on the estimated two or more bit error rates and the identified error correction level.

In one example, a computer readable storage medium is generally described. The computer readable storage medium may include one or more controller executable instructions stored thereon. In response to execution by a controller, the one or more controller-executable instructions may adapt the controller to perform or cause to be performed estimation of two or more bit error rates. The two or more bit error rates may be associated with application of respective voltages to read from a memory. In response to execution by a controller, the one or more controller-executable instructions may adapt the controller to perform or cause to be performed an identification of an error correction level available to correct read errors from the memory. In response to execution by a controller, the one or more controller-executable instructions may adapt the controller to perform or cause to be performed a selection of a voltage to read from the memory. The voltage may be selected based on the two or more bit error rates and the error correction level.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 7 is a block diagram illustrating an example computing device that is arranged to implement reduction of power consumption in flash memory; all arranged according to at least some embodiments described herein.

DETAILED DESCRIPTION

Figure 1:
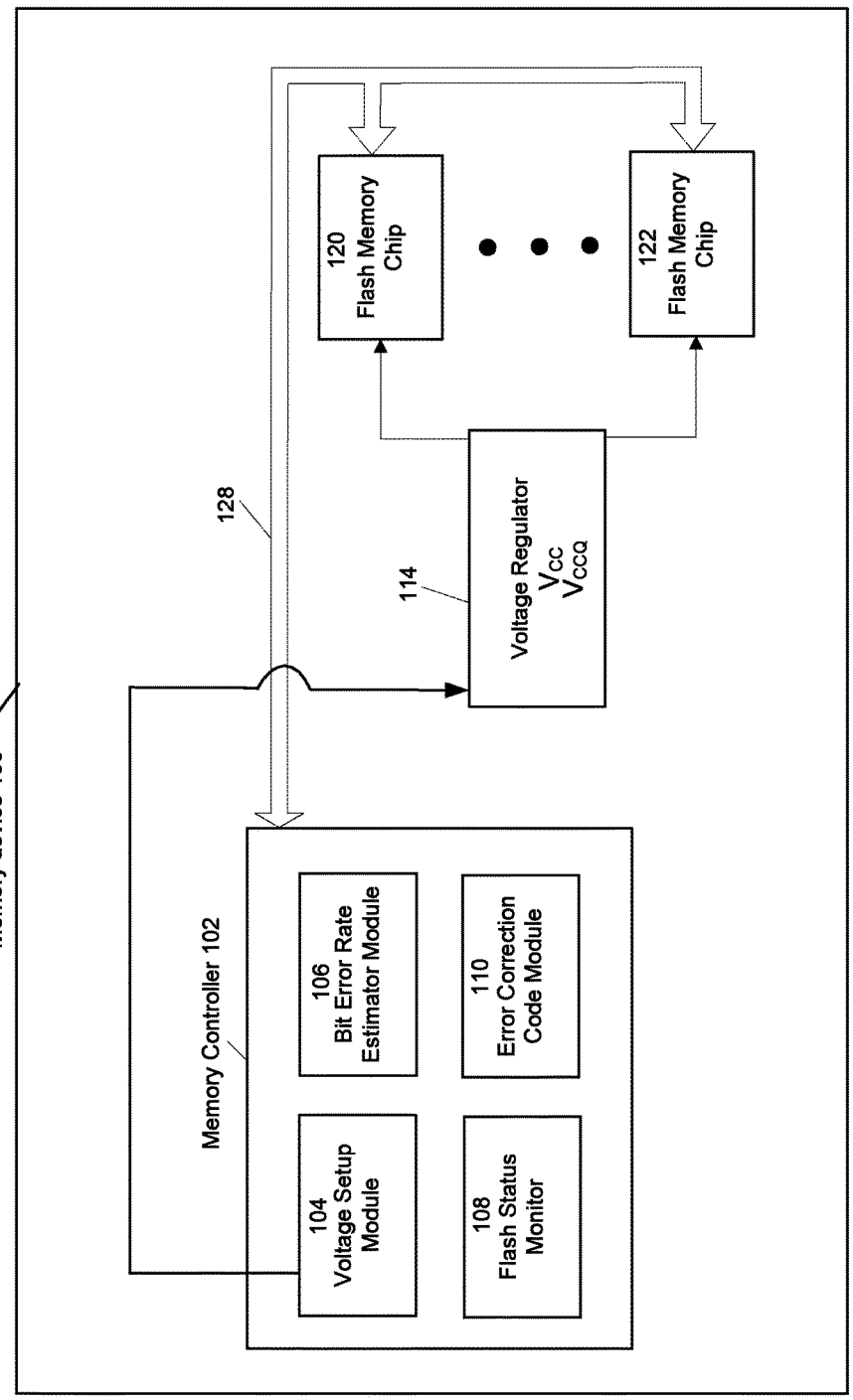
FIG. 1 illustrates an example system that can be utilized to implement reduction of power consumption in flash memory.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the drawings, can be arranged, substituted, combined, separated, and designed in a wide variety of different configurations, all of which are explicitly contemplated herein.

This disclosure is generally drawn to, inter alia, methods, apparatus, systems, devices, and computer program products related to reduction of power consumption in flash memory.

Briefly stated, technologies are generally described for systems, devices and methods effective to reduce power consumption in flash memory. In some examples, a bit error rate estimator module may estimate two or more bit error rates. The two or more bit error rates may be associated with application of respective voltages to read from a memory. A voltage setup module may be configured to be in communication with the bit error rate estimator module. The voltage setup module may be configured to select a voltage to read from the memory. The voltage may be selected based on the two or more bit error rates and based on an error correction level. The error correction level may be a tolerance level available to correct read errors from the memory.

FIG. 1 illustrates an example system that can be utilized to implement reduction of power consumption in flash memory arranged in accordance with at least some embodiments described herein. An example memory device 100 may include a memory controller 102. Memory device 100 may include one or more chips. Memory controller 102 may be a dedicated chip or may be integrated into another chip, such as a microprocessor. Memory controller 102 may control reads of one or more flash memory chips 120, 122. A read may include the detection and/or transmission of one or more bits stored at a location in flash memory chips 120, 122.

Memory controller 102 may include a bit error rate estimator module 106. A bit error rate may be the probability of experiencing a detection bit error or transmission bit error. Bit error rate estimator module 106 may estimate the bit error rate of flash memory detect operations associated with different applied flash memory core supply voltages ("$V_{CC}$"). Additionally, bit error rate estimator module 106 may estimate the transmission bit error rate of data transferred from flash memory chips 120, 122 to memory controller 102 with different input/output supply voltages ("$V_{CCQ}$").

Memory controller 102 may include voltage setup module 104. Voltage setup module 104 may be configured to select voltages $V_{CC}$ and/or $V_{CCQ}$ to reduce power consumption of memory device 100. Voltage setup module 104 may send an output/signal to a voltage regulator 114. Voltage regulator 114 may be configured to control application of different voltages to one or more flash memory chips 120, 122. Two flash memory chips (120 and 122) are depicted, though any number of flash memory chips may be used. Flash memory chips 120, 122 may be NAND flash memory or NOR flash memory and/or other types of flash memory. Flash memory chips 120, 122 may be erasable and reprogrammable. Flash memory chips 120, 122 may communicate with memory controller 102 via link 128. Link 128 may be, for example, a bus.

Memory controller 102 may include a flash status monitor 108. Flash status monitor 108 may be configured to determine a level of degradation of flash memory chips 120, 122. For example, flash status monitor 108 may determine the level of degradation of flash memory chip 120 by determination of a number of program and/or erase cycles performed by flash memory chip 120. As flash memory degrades, the flash memory may be more susceptible to detection bit errors and/or transmission bit errors.

To correct detection and/or transmission bit errors, memory controller 102 may include an error correction code module 110. Detection bit errors may include errors in detecting data out of flash memory chips 120, 122. Transmission bit errors may include errors in transmitting data from flash memory chips 120, 122, over link 128 to memory controller 102. Error correction code module 110 may be configured to correct detection or transmission errors within memory device 100. Error correction code module 110 may correct errors by, for example, adding redundant data (or "parity" data) to a string of bits. Adding redundant data may allow a bit to be recovered even when a number of errors were introduced during bit detection and/or transmission. The various modules and other components of memory device 100 may be operatively coupled to each other, for example via link 128 and/or other structure that couples two or more components together.

Figure 2:
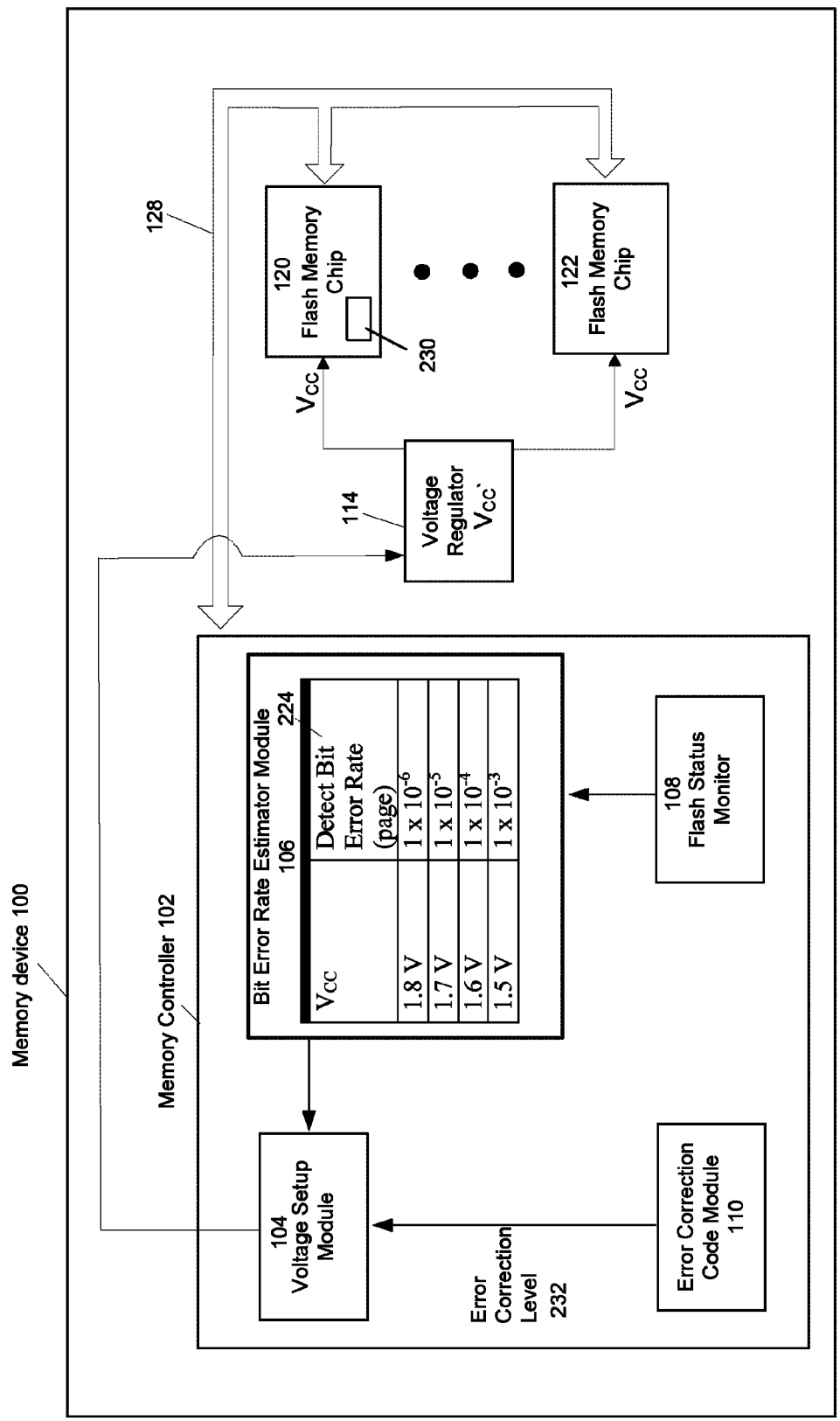
FIG. 2 depicts the example system of FIG. 1, illustrating additional details relating to a bit error rate estimator.

FIG. 2 illustrates the example system of FIG. 1 with additional details relating to a bit error rate estimator module (such as bit error rate estimator module 106) arranged in accordance with at least some embodiments described herein. Those components in FIG. 2 that are labeled identically to components of FIG. 1 will not be described again for the purposes of clarity and brevity.

In an example, memory controller 102 may generate a table of voltages and bit error rates that can be used to select a voltage. For example, memory controller 102 may receive a request to detect data stored in flash memory chip 120. A request to detect data may be, for example, application of voltage Vcc to acquire data stored in gates of flash memory chip 120. Detected data may then be transmitted from the respective chip to memory controller 102.

To detect stored data, memory controller 102 may call one or more flash translation layer functions to determine the physical memory page location that may store the requested data. In this example, the physical memory page may be page 230, at a location on flash memory chip 120. Flash status monitor 108 may provide bit error rate estimator module 106 with a level of degradation of page 230 of flash memory chip 120. The level of degradation may be determined by, for example, using program/erase cycling information and/or a record of latest detect bit error statistics for page 230. Program/erase cycling information may include the number of times a particular page of flash memory has been written to, erased, and then rewritten. Based on the provided level of degradation of page 230, bit error rate estimator module 106 may generate a detect error estimation table 224. Detect error estimation table 224 may be, for example, a data structure stored in bit error rate estimator module 106 or in another memory.

Detect error estimation table 224 may include estimations of detect bit error rates relating to detection of data in pages in flash memory chips 120, 122 for application of different possible values of $V_{CC}$. For example, with reference to the first row of detect error estimation table 224, at a $V_{CC}$ value of 1.8 V, page 230 may be estimated to have a detect bit error rate of $1 \times 10^{-6}$. In another example with reference to row 2 of detect error estimation table 224, at a $V_{CC}$ value of 1.7 V, page 230 may be estimated to have a detect bit error rate of $1 \times 10^{-5}$. Voltage setup module 104 may have access to data stored in detect error estimation table 224.

Continuing with the above example, error correction code module 110 may provide voltage setup module 104 with an error correction level. Error correction level 232 may be, for example, an approximate percentage of errors which the error correction code is configured to correct. In another example, error correction level may be a tolerance level available to correct read errors from the memory. Such a tolerance level may be a maximum percentage of errors, for a given amount of data, that error correction code module 110 is able to correct. Based on error correction level 232 and detect error estimation table 224, voltage setup module 104 may be configured to select a particular voltage, $V_{CC}'$ that is usable to obtain a target bit error rate that represents a reduced number of bit errors. $V_{CC}'$ may be the lowest value of $V_{CC}$ in table 224 with an associated detect bit error rate less than error correction level 232. A signal corresponding to particular voltage $V_{CC}'$ may be sent to voltage regulator 114. Voltage regulator 114 may control application of particular voltage $V_{CC}'$ to flash memory chip 120 and/or flash memory chip 122. In the instant example, error correction level 232 of memory controller 102 may be $5\times10^{-4}$ (or 0.05%). Based on detect error estimation table 224, voltage setup module 104 may select particular voltage $V_{CC}'$ of 1.6V, as 1.6V is the lowest voltage with an associated detect bit error rate less than error correction level 232 (e.g. $1\times10^{-4}<5\times10^{-4}$).

In a further example, at some future point in time, the level of degradation of page 230 may have increased as may be detected by flash status monitor 108. As such, when bit error rate estimator module 106 generates a new or revised detect error estimation table 224, the detect bit error rates for each respective voltage may have increased. This change in detection bit error rates may cause voltage setup module 104 to select a higher voltage $V_{CC}'$ (relative to previous values of $V_{CC}'$) so that the detect bit error rate remains less than error correction level 232.

Figure 3:
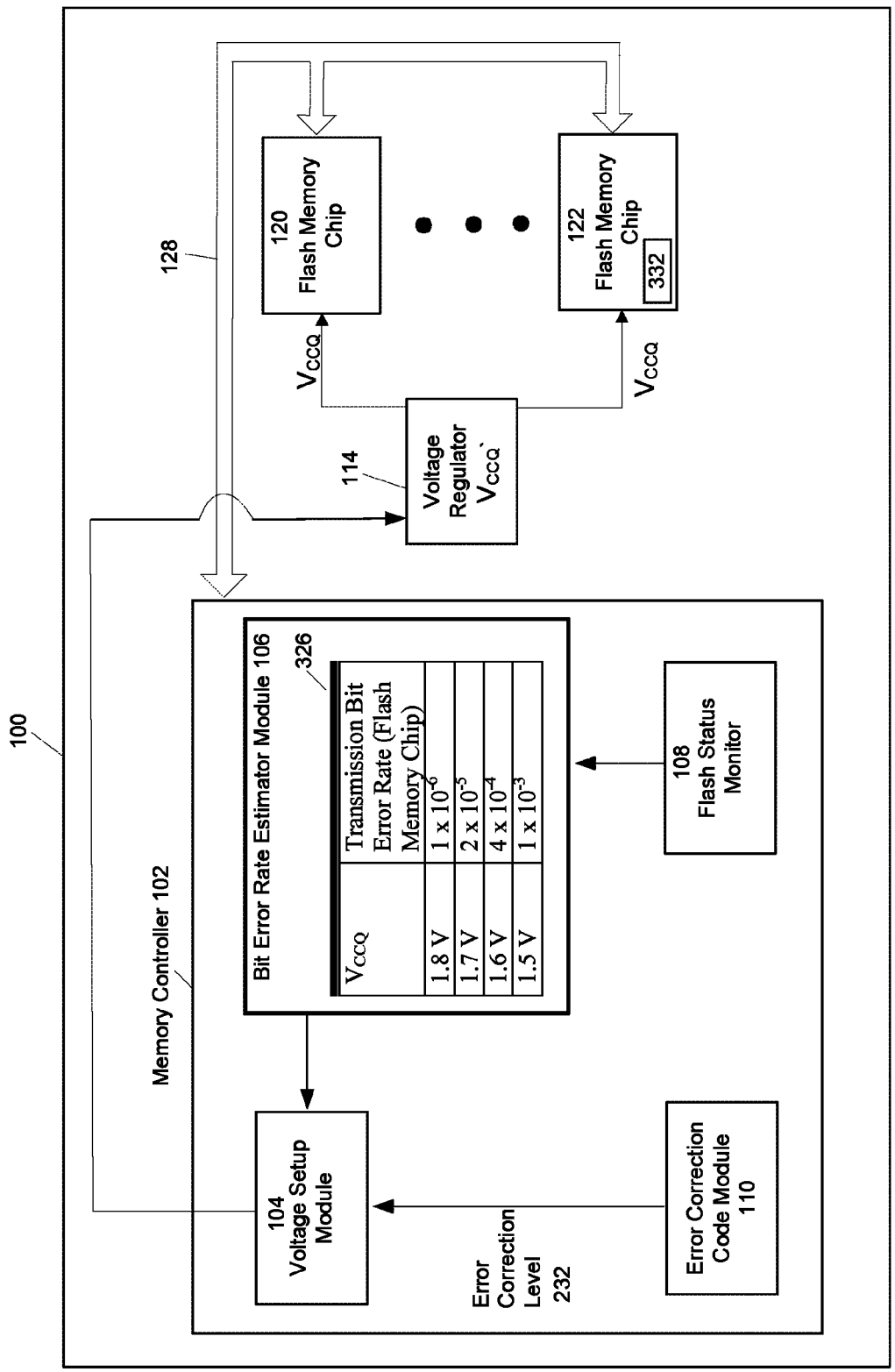
FIG. 3 depicts the example system of FIG. 1, illustrating an example relating to transmission of data.

FIG. 3 depicts the example system of FIG. 1 illustrating an example relating to transmission of data arranged in accordance with at least some embodiments described herein. Those components in FIG. 3 that are labeled identically to components of FIGS. 1 and 2 will not be described again for the purposes of clarity and brevity.

In an example, memory controller 102 may receive a request to transmit data stored in flash memory chip 122. Memory controller 102 may call one or more flash translation layer functions to determine the physical memory page location that may store the requested data. In an example, the physical memory page may be page 332 at a location on flash memory chip 122. The requested data may be detected from page 332 of flash memory chip 122.

A transmission error estimation table 326, which may be generated and/or maintained by bit error rate estimation module 106 in a manner somewhat similar to detect error estimation table 224 described above, may include estimations of transmission bit error rates relating to transmission between flash memory chips and memory controller 102 associated with different possible values of $V_{CCQ}$. For example, with reference to the first row of transmission error estimation table 326, at a $V_{CCQ}$ value of 1.8 V, flash memory chip 122 may be estimated to have a transmission bit error rate of $1\times10^{-6}$. In another example with reference to row 2 of transmission error estimation table 326, at a $V_{CCQ}$ value of 1.7 V, flash memory chip 122 may be estimated to have a transmission bit error rate of $2\times10^{-5}$. Voltage setup module 104 may have access to data stored in transmission error estimation table 326.

Continuing with the above example, error correction code module 110 may provide voltage setup module 104 with error correction level 232 Based on error correction level 232 and transmission error estimation table 326, voltage setup module 104 may be configured to select a particular voltage, $V_{CCQ}'$. $V_{CCQ}'$ may be the lowest value of $V_{CCQ}$ in table 326 with an associated transmission bit error rate less than error correction level 232. A signal corresponding to particular voltage $V_{CCQ}'$ may be sent to voltage regulator 114. Voltage regulator 114 may control application of particular voltage $V_{CCQ}'$ to flash memory chip 120 and/or flash memory chip 122. In the instant example, error correction level 232 of memory controller 102 may be $3\times10^{-4}$ (or 0.03%). Based on transmission error estimation table 326, voltage setup module 104 may select particular voltage $V_{CCQ}'$ of 1.7V, as 1.7V is the lowest voltage with an associated transmission bit error rate less than error correction level 232 (e.g. $2\times10^{-5}<3\times10^{-4}$).

In a further example, at some future point in time, respective transmission bit error rates for different values of $V_{CCQ}$ may have increased as may be detected by flash status monitor 108. Bit error rate estimator module 106 may generate a new transmission error estimation table 326 (or update an existing transmission error estimation table 326). The increase of the bit error rates may cause voltage setup module 104 to select a higher voltage $V_{CCQ}'$ (relative to previous values of $V_{CCQ}'$) so that the transmission bit error rate remains less than error correction level 232.

Figure 4:
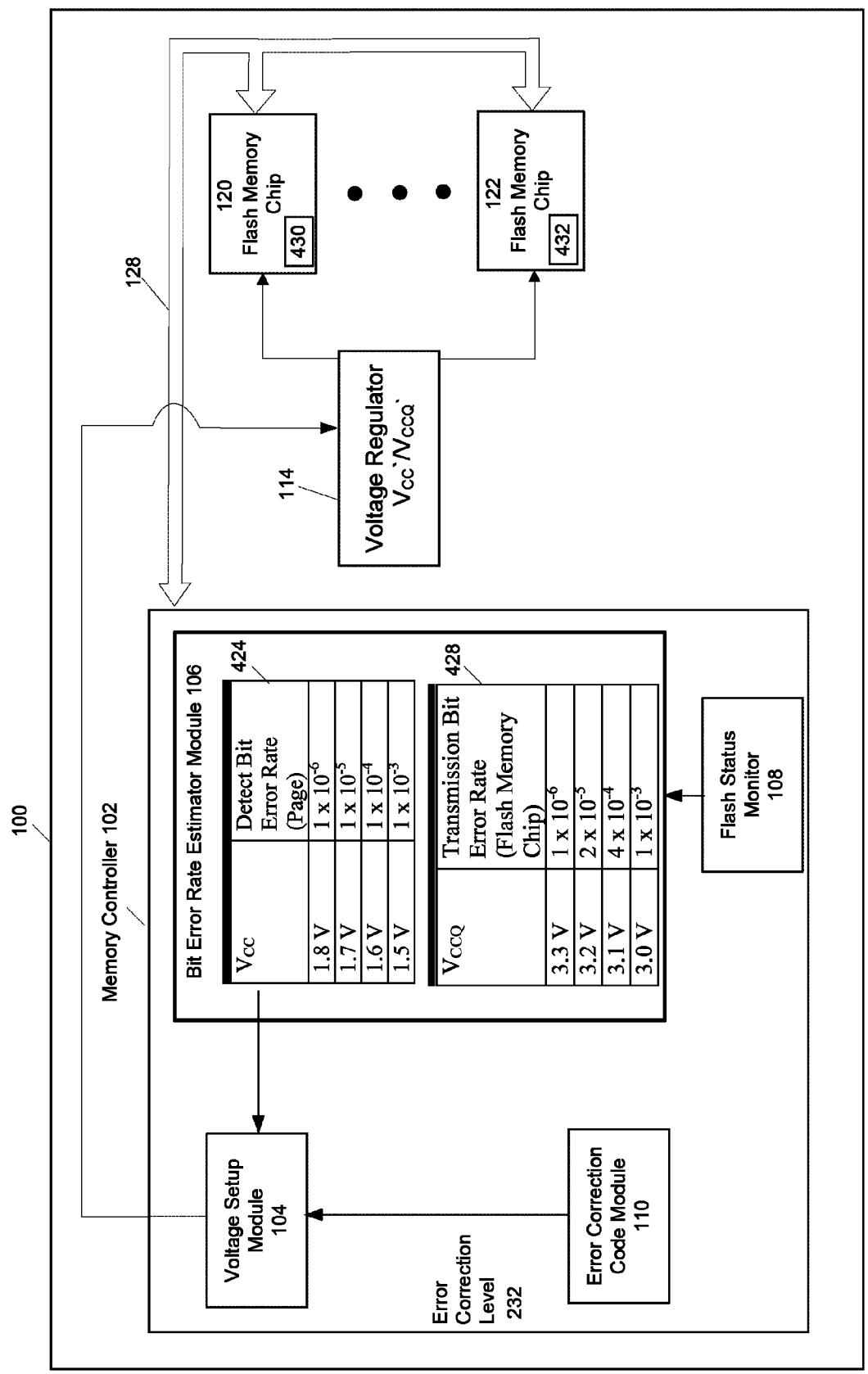
FIG. 4 depicts the example system of FIG. 1, illustrating an example relating to transmission and detection of data.

FIG. 4 depicts the example system of FIG. 1 illustrating an example relating to transmission and detection of data arranged in accordance with at least some embodiments described herein. Those components in FIG. 4 that are labeled identically to components of FIGS. 1, 2 and 3 will not be described again for the purposes of clarity and brevity.

Voltages $V_{CC}'$ and $V_{CCQ}'$ may be simultaneously and/or separately (such as in sequence) adjusted to reduce power consumption in flash memory chips. In an example, memory controller 102 may receive a request to read data in flash memory chip 122. Memory controller 102 may call one or more flash translation layer functions to determine the physical memory page location that stores the requested data. In an example, the physical memory page may be page 432 located on flash memory chip 122. The requested data may be detected from page 432 of flash memory chip 122.

A transmission error estimation table 428 may include an estimation of the transmission bit error rate of transmission between flash memory chips and memory controller 102 associated with different possible values of $V_{CCQ}$. For example, with reference to the first row of transmission error estimation table 428, at a $V_{CCQ}$ value of 3.3V, flash memory chip 122 may be estimated to have a transmission bit error rate of $1\times10^{-6}$. In another example with reference to row 2 of transmission error estimation table 428, at a $V_{CCQ}$ value of 3.2V, page 432 may be estimated to have a transmission bit error rate of $2\times10^{-5}$. Voltage setup module 104 may have access to data stored in transmission error estimation table 428.

Contemporaneously or otherwise, memory controller 102 may receive a request to read data stored in flash memory chip 120. Memory controller 102 may call one or more flash translation layer functions to determine the physical memory page location that may store the requested data. In this example, the physical memory page may be page 430, located in flash memory chip 120. Flash status monitor 108 may provide bit error rate estimator module 106 with a level of degradation of page 430 of flash memory chip 120. Based on the provided level of degradation of page 430, bit error rate estimator module 106 may generate (or update) a detect error estimation table 424. Detect error estimation table 424 may be, for example, a data structure stored in bit error rate estimator module 106 or in another memory.

Detect error estimation table 424 may include estimations of detect bit error rates for detection of page 430 in flash memory chip 120 for different possible values of $V_{CC}$. For example, with reference to the first row of detect error estimation table 424, at a $V_{CC}$ value of 1.8V, page 430 may be estimated to have a detect bit error rate of $1\times10^{-6}$. In another example with reference to row 2 of detect error estimation table 424, at a $V_{CC}$ value of 1.7V, page 430 may be estimated to have a detect bit error rate of $1\times10^{-5}$. Voltage setup module 104 may have access to data stored in detect error estimation table 424.

Continuing with the above example, error correction code module 110 may provide voltage setup module 104 with error correction level 232 of error correction code module 110. Error correction level 232 may be, for example, a percentage of errors which the error correction code is configured to correct. Based on error correction level 232, detect error estimation table 424 and transmission error estimation table 428, voltage setup module 104 may be configured to select particular voltages, $V_{CC}'$ and $V_{CCQ}'$. $V_{CC}'$ and $V_{CCQ}'$ may be the lowest combination value of $V_{CC}$ and $V_{CCQ}$ in tables 424 and 428 with a combined associated bit error rate (detect bit error rate+transmission bit error rate) less than error correction level 232. In examples where there are multiple combinations of $V_{CC}$ and $V_{CCQ}$ in tables 424 and 428 which may sum to the same lowest combination value, voltage setup module 104 may examine available possible combinations of $V_{CC}$ and $V_{CCQ}$, and choose the combination $V_{CC}'+V_{CCQ}'$ that leads to the lowest overall power consumption. Signals corresponding to particular voltages $V_{CC}'$ and $V_{CCQ}'$ may be sent to voltage regulator 114. Voltage regulator 114 may control application of particular voltages $V_{CC}'$ and $V_{CCQ}'$ to flash memory chip 120 and/or flash memory chip 122. In the instant example, error correction level 232 of memory controller 102 may be $3 \times 10^{-4}$ (or 0.03%). Based on detect error estimation table 424 and transmission error estimation table 428, voltage setup module 104 may select particular voltage $V_{CC}'$ of 1.6V and particular voltage $V_{CCQ}'$ of 3.2V. 1.6V and 3.2V may represent the lowest voltages with a combined associated bit error rate less than error correction level 232 (e.g. $1 \times 10^{-4} + 2 \times 10^{-5} = 1.2 \times 10^{-4} < 3 \times 10^{-4}$).

According to the above example, voltage setup module 104 may send signals corresponding to the particular voltages $V_{CCQ}'$ and $V_{CC}'$ to voltage regulator 114. Voltage regulator 114 may control application of the specified $V_{CC}'$ and/or $V_{CCQ}'$ voltages to flash memory chip 120 and/or flash memory chip 122.

Among other possible features, a system in accordance with the disclosure may leverage error correction code strength to reduce energy consumption of flash memory detection and transmit operations. Additionally, a system in accordance with the disclosure may realize such power saving benefits without compromising the integrity of data detect/transfer operations. A system may leverage the extra error correction code tolerance that may be available when a memory device is relatively new and has experienced little degradation. Reduction of power consumption may have particular relevance for mobile devices using flash based memory systems.

Figure 5:
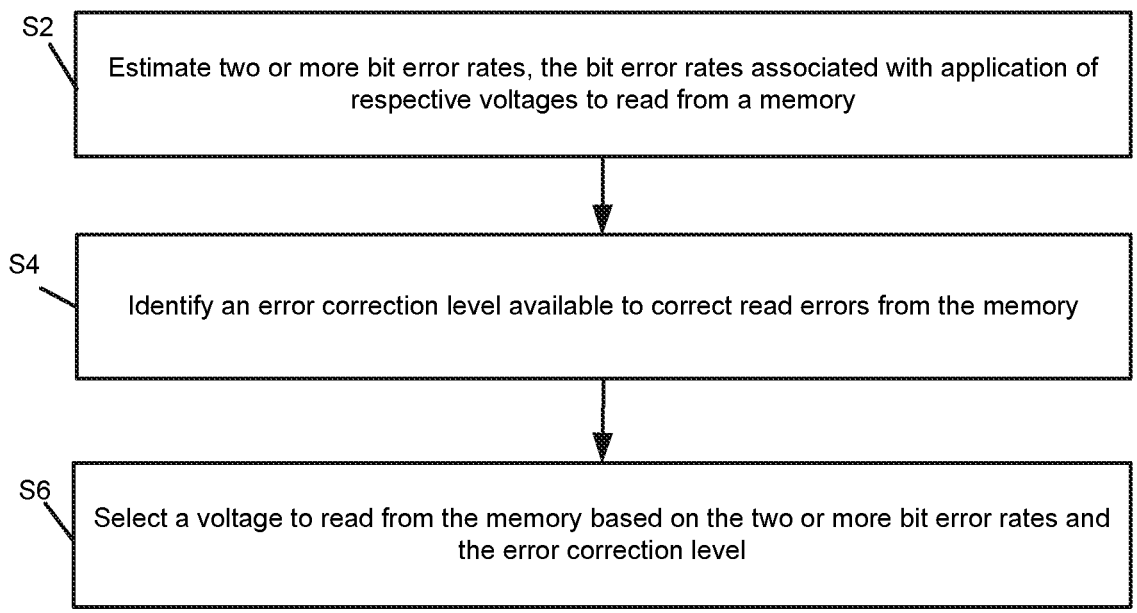
FIG. 5 depicts a flow diagram for an example process to implement a reduction of power consumption in flash memory.

FIG. 5 depicts a flow diagram for example processes to implement reduction of power consumption in flash memory arranged in accordance with at least some embodiments described herein. In some examples, the process in FIG. 5 could be implemented using memory device 100 discussed above and could be used to reduce power consumption in flash memory. An example process may include one or more operations, actions, or functions as illustrated by one or more of blocks S2, S4, and/or S6. Although illustrated as discrete blocks, various blocks may be divided into additional blocks, combined into fewer blocks, or eliminated, depending on the desired implementation. The process in FIG. 5 may be used by a memory device that includes a memory controller, such as memory controller 102. In some embodiments, additional blocks representing further other operations, actions, or functions may be provided. The memory controller may be configured in communication with one or more flash memory chips.

Processing may begin at block S2, "Estimate two or more bit error rates, the bit error rates associated with application of respective voltages to read from a memory." At block S2, two or more bit error rates may be estimated. The bit error rates may be associated with application of respective voltages to read from a memory. A bit error rate estimator (such as bit error rate estimator module 106) may estimate the two or more bit error rates. In an example, the bit error rate estimator may be configured to estimate the two or more bit error rates based on a level of degradation of one or more flash memory locations. A flash status monitor (such as flash status monitor 108) may be effective to determine the level of degradation. The level of degradation may be based on a number of program and/or erase cycles of the one or more flash memory locations. In an example, the two or more bit error rates may relate to detection of data from a location in the memory. In another example, the two or more bit error rates may relate to transmission of data from a location in the memory to the memory controller. In another example, the two or more bit error rates may relate to both detection of data from a location in the memory and transmission of the data from the location in the memory to the memory controller.

Processing may continue from block S2 to block S4, "Identify an error correction level available to correct read errors from the memory." At block S4, an error correction level may be identified. The error correction level may be available to correct read errors from the memory.

Processing may continue from block S4 to block S6, "Select a voltage to read from the memory based on the two or more bit error rates and the error correction level." At block S6, a voltage may be selected to read from the memory. The voltage may be selected by a voltage setup module (such as voltage setup module 104). The voltage may be selected based on the two or more bit error rates and the error correction level. In an example, the voltage setup module may be configured to select the voltage by selection of a lowest respective voltage with an associated bit error rate less than the error correction level. In another example, the voltage setup module may be configured to select the voltage by selection of a lower (but not necessarily the lowest) respective voltage with an associated bit error rate less than the error correction level. In yet another example, the voltage setup module may be configured to select the voltage based on a first bit error rate related to detection of data from a location in the memory, a second bit error rate related to transmission of the data from the location in the memory to the memory controller, and the error correction level.

Figure 6:
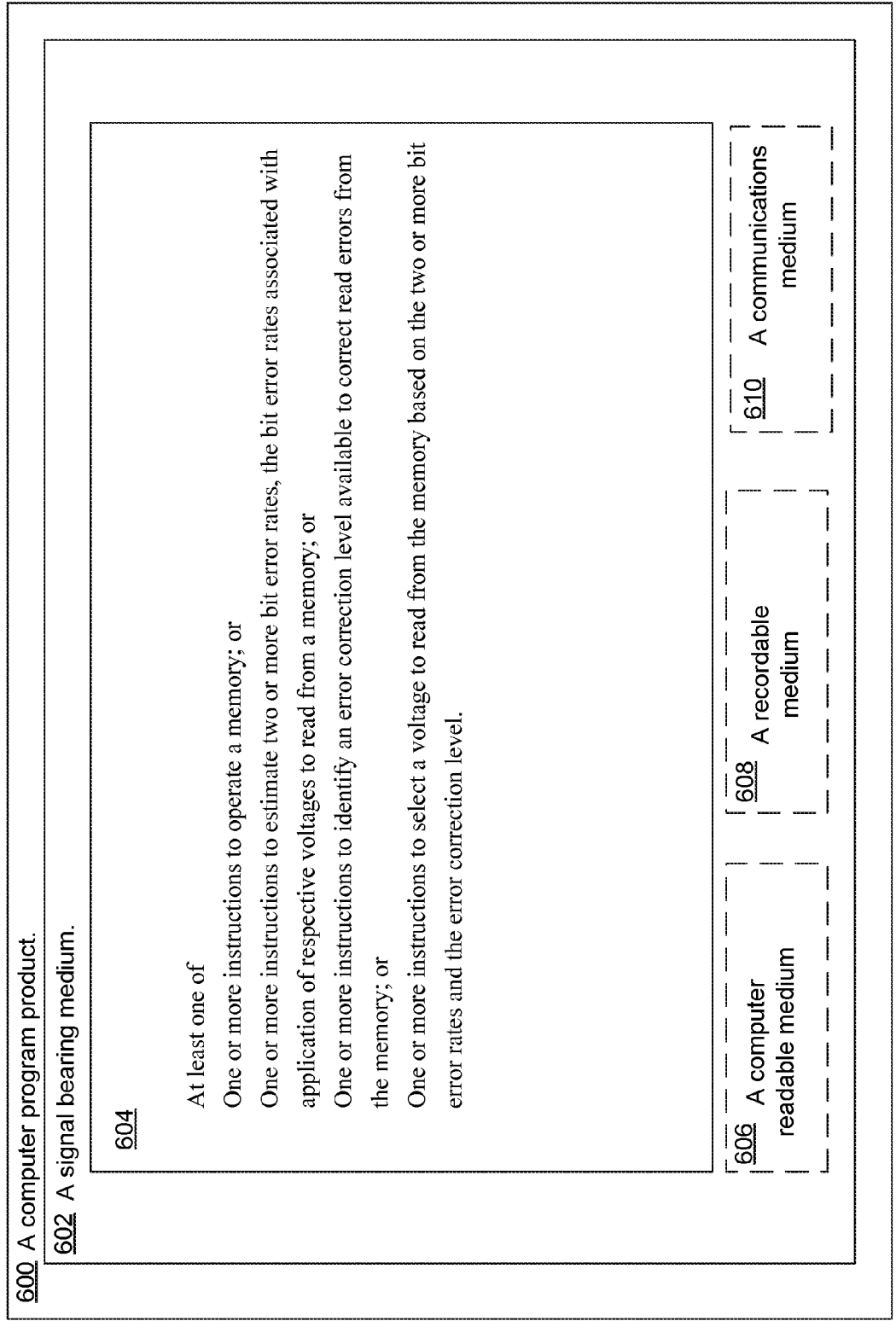
FIG. 6 illustrates an example computer program product that can be utilized to implement reduction of power consumption in flash memory.

FIG. 6 illustrates an example computer program product 600 that can be utilized to implement reduction of power consumption in flash memory arranged in accordance with at least some embodiments described herein. Computer program product 600 may include a signal bearing medium 602. Signal bearing medium 602 may include one or more instructions 604 that, in response to execution by, for example, a processor, may provide the features described above with respect to FIGS. 1-5. Thus, for example, referring to memory device 100, voltage setup module 104 may undertake one or more of the blocks shown in FIG. 6 in response to instructions 604 conveyed to memory device 100 by signal bearing medium 602.

In some implementations, signal bearing medium 602 may encompass a non-transitory computer-readable medium 606, such as, but not limited to, a hard disk drive (HDD), a Compact Disc (CD), a Digital Video Disk (DVD), a digital tape, memory, etc. In some implementations, signal bearing medium 602 may encompass a recordable medium 608, such as, but not limited to, memory, read/write (R/W) CDs, R/W DVDs, etc. In some implementations, signal bearing medium 602 may encompass a communications medium 610, such as, but not limited to, a digital and/or an analog communication medium (e.g., a fiber optic cable, a waveguide, a wired communication link, a wireless communication link, etc.). Thus, for example, computer program product 600 may be conveyed to one or more modules of the memory device 100 by an RF signal bearing medium 602, where the signal bearing medium 602 is conveyed by a wireless communications medium 610 (e.g., a wireless communications medium conforming with the IEEE 802.11 standard).

FIG. 7 is a block diagram illustrating an example computing device 700 that is arranged to implement reduction of power consumption in flash memory arranged in accordance with at least some embodiments described herein. In a very basic configuration 702, computing device 700 typically includes one or more processors 704 and a system memory 706. A memory bus 708 may be used for communicating between processor 704 and system memory 706.

Depending on the desired configuration, processor 704 may be of any type including but not limited to a microprocessor (µP), a microcontroller (µC), a digital signal processor (DSP), or any combination thereof. Processor 704 may include one or more levels of caching, such as a level one cache 710 and a level two cache 712, a processor core 714, and registers 716. An example processor core 714 may include an arithmetic logic unit (ALU), a floating point unit (FPU), a digital signal processing core (DSP core), or any combination thereof. An example memory controller 718 may also be used with processor 704, or in some implementations memory controller 718 may be an internal part of processor 704 Memory controller 718 may be memory controller 102 from FIGS. 1-4. Alternatively, memory controller 718 may be a different memory controller.

Depending on the desired configuration, system memory 706 may be of any type including but not limited to volatile memory (such as RAM), non-volatile memory (such as ROM, flash memory, etc.) or any combination thereof. System memory 706 may include an operating system 720, one or more applications 722, one or more programmable circuits 766 and program data 724. Application 722 may include a reduction in power consumption in flash memory algorithm 726 that is arranged to perform the operations as described herein including those described with respect to memory device 100 of FIGS. 1-6. Program data 724 may include reduction of power consumption in flash memory data 728 that may be useful to implement reduction of power consumption in flash memory as is described herein. In some embodiments, application 722 may be arranged to operate with program data 724 on operating system 720 such that reduction of power consumption in flash memory may be provided. This described basic configuration 702 is illustrated in FIG. 7 by those components within the inner dashed line.

Computing device 700 may have additional features or functionality, and additional interfaces to facilitate communications between basic configuration 702 and any required devices and interfaces. For example, a bus/interface controller 730 may be used to facilitate communications between basic configuration 702 and one or more data storage devices 732 via a storage interface bus 734. Data storage devices 732 may be removable storage devices 736, non-removable storage devices 738, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 706, removable storage devices 736 and non-removable storage devices 738 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 700. For example, flash memory chips 120, 122 from FIGS. 1-4 may be examples of computer storage media. Any such computer storage media may be part of computing device 700.

Computing device 700 may also include an interface bus 740 for facilitating communication from various interface devices (e.g., output devices 742, peripheral interfaces 744, and communication devices 746) to basic configuration 702 via bus/interface controller 730. Link 128 previously described above may be embodied in at least a portion of the bus(es) shown in FIG. 7. Example output devices 742 include a graphics processing unit 748 and an audio processing unit 750, which may be configured to communicate to various external devices such as a display or speakers via one or more A/V ports 752. Example peripheral interfaces 744 include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 746 includes a network controller 760, which may be arranged to facilitate communications with one or more other computing devices 762 over a network communication link via one or more communication ports 764.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 700 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 700 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A memory controller, comprising:
   a bit error rate estimator module configured to estimate two or more bit error rates, wherein the two or more bit error rates are associated with application of respective voltages to read from a memory, and
   wherein the two or more bit error rates relate to:
      detection of data from a location in the memory; and
      transmission of the data from the location in the memory to the memory controller; and
   a voltage setup module configured to be in communication with the bit error rate estimator module, wherein the voltage setup module is further configured to select a voltage to read from the memory based on the two or more bit error rates and based on an error correction level, wherein the selection of the voltage includes a selection of a lowest respective voltage with an associated bit error rate that is less than the error correction level, and
   wherein the error correction level is a tolerance level for correction of read errors from the memory.

2. The memory controller of claim 1, further comprising an error code correction module coupled to the bit error rate estimator module, wherein the error code correction module is configured to correct the read errors from the memory at the error correction level.

3. The memory controller of claim 1, wherein the bit error rate estimator module is configured to estimate the two or more bit error rates based on a level of degradation of one or more flash memory locations.

4. The memory controller of claim 3, further comprising a flash status monitor configured in communication with the bit error rate estimator module, wherein the flash status monitor is effective to determine the level of degradation.

5. The memory controller of claim 4, wherein the level of degradation is based on a number of program and/or erase cycles of the one or more flash memory locations.

6. The memory controller of claim 1, wherein to estimate the two or more bit error rates, the bit error rate estimation module is configured to:
- estimate a first bit error rate that relates to detection of the data from the location in the memory; and
- estimate a second bit error rate that relates to transmission of the data from the location in the memory to the memory controller,
- wherein to select the voltage, the voltage setup module is configured to select the voltage based on the first bit error rate, the second bit error rate, and the error correction level.

7. A method to operate a memory, the method comprising:
- estimating two or more bit error rates, wherein the estimated two or more bit error rates are associated with application of respective voltages to read from the memory;
- identifying an error correction level for correction of read errors from the memory; and
- selecting a voltage to read from the memory based on the estimated two or more bit error rates and the identified error correction level,
- wherein selecting the voltage to read from the memory includes selecting a lowest respective voltage with an associated bit error rate that is less than the identified error correction level.

8. The method of claim 7, wherein estimating the two or more bit error rates includes estimating the two or more bit error rates based on a level of degradation of one or more flash memory locations.

9. The method of claim 8, wherein the level of degradation is based on a number of program and/or erase cycles of the one or more flash memory locations.

10. The method of claim 7, wherein estimating the two or more bit error rates includes estimating a bit error rate that relates to detection of data from a location in the memory.

11. The method of claim 7, wherein estimating the two or more bit error rates includes estimating a bit error rate that relates to transmission of data from a location in the memory to a memory controller.

12. The method of claim 7, wherein estimating the two or more bit error rates includes:
- estimating a first bit error rate that relates to detection of data from a location in the memory; and
- estimating a second bit error rate that relates to transmission of the data from the location in the memory to a memory controller,
- wherein selecting the voltage includes selecting the voltage based on the first bit error rate, the second bit error rate, and the error correction level.

13. The method of claim 7, further comprising:
- applying the voltage to the memory; and
- reading data from the memory.

14. A non-transitory computer readable storage medium, that includes one or more controller-executable instructions stored thereon which, in response to execution by a controller, adapt the controller to perform or cause to be performed:
- estimation of two or more bit error rates, wherein the two or more bit error rates are associated with application of respective voltages to read from a memory;
- identification of an error correction level for correction of read errors from the memory; and
- selection of a voltage to read from the memory based on the estimated two or more bit error rates and the identified error correction level,
- wherein the selection of the voltage to read from the memory includes the selection of a lowest respective voltage with an associated bit error rate that is less than the identified error correction level.

* * * * *